US008026925B2

(12) United States Patent
Lee et al.

(10) Patent No.: US 8,026,925 B2
(45) Date of Patent: Sep. 27, 2011

(54) APPARATUS AND METHOD FOR DISPLAYING PICTURE IN PORTABLE TERMINAL

(75) Inventors: Dong-Seop Lee, Suwon-si (KR); Kyung-Goo Lee, Seoul (KR)

(73) Assignee: Samsung Electronics Co., Ltd (KR)

( * ) Notice: Subject to any disclaimer, the term of this patent is extended or adjusted under 35 U.S.C. 154(b) by 939 days.

(21) Appl. No.: 11/935,238

(22) Filed: Nov. 5, 2007

(65) Prior Publication Data

US 2008/0106553 A1 May 8, 2008

(30) Foreign Application Priority Data

Nov. 6, 2006 (KR) ........................ 10-2006-0108723

(51) Int. Cl.

| | |
|---|---|
| ***G09G 5/00*** | (2006.01) |
| ***G09G 5/02*** | (2006.01) |
| ***G09G 3/30*** | (2006.01) |
| ***G06T 17/00*** | (2006.01) |
| ***H04N 1/46*** | (2006.01) |
| ***G03F 3/08*** | (2006.01) |
| ***G06K 9/40*** | (2006.01) |
| *G06K 9/00* | (2006.01) |
| *G02F 1/13335* | (2006.01) |

(52) U.S. Cl. ........ 345/589; 345/428; 345/581; 345/207; 345/77; 349/61; 358/504; 358/509; 358/516; 358/518; 382/167; 382/274

(58) Field of Classification Search .................... 348/68, 348/655, 759–761; 349/69–70, 97, 41, 108, 349/16, 61–63; 345/102, 207, 426, 428, 345/581, 589, 600, 619, 48, 690, 38, 63, 345/77; 315/312; 356/402; 250/205; 358/504, 358/509, 510, 516, 518, 520; 382/162, 167, 382/274, 312

See application file for complete search history.

(56) References Cited

U.S. PATENT DOCUMENTS

| | | | | |
|---|---|---|---|---|
| 6,036,328 A * | 3/2000 | Ohtsuki et al. | ................ | 362/612 |
| 6,278,507 B1 * | 8/2001 | Nakamura | .................... | 349/106 |
| 7,636,086 B2 | 12/2009 | Kim et al. | | |

(Continued)

FOREIGN PATENT DOCUMENTS

| | | |
|---|---|---|
| CN | 1400579 | 3/2003 |

(Continued)

*Primary Examiner* — Wesner Sajous

(74) *Attorney, Agent, or Firm* — The Farrell Law Firm, P.C.

(57) ABSTRACT

Provided is an apparatus and method for displaying a picture in a portable terminal. The method includes identifying a visibility color quality corresponding to the external brightness upon sensing of generation of a visibility control event, identifying external brightness, identifying a set color quality that is a color quality currently output to a display unit, comparing whether the visibility color quality is equal to the set color quality, and altering the set color quality into the visibility color quality when the comparison result is that the visibility color quality is not equal to the set color quality.

19 Claims, 2 Drawing Sheets

U.S. PATENT DOCUMENTS

2002/0124808 A1* 9/2002 Zampelli et al. .............. 119/497
2003/0117364 A1 6/2003 Miyake
2003/0214655 A1* 11/2003 Weiss et al. ................... 356/402
2005/0035939 A1* 2/2005 Akiyama ...................... 345/102
2005/0212728 A1* 9/2005 Miller et al. .................... 345/76
2005/0212824 A1* 9/2005 Marcinkiewicz et al. .... 345/690
2005/0253835 A1 11/2005 Kawase
2006/0022934 A1* 2/2006 Whitted et al. ............... 345/102
2006/0038930 A1* 2/2006 Kaneko ........................... 349/41
2006/0244702 A1 11/2006 Yamazaki et al.
2007/0064178 A1* 3/2007 Murai ........................... 349/108
2007/0145915 A1* 6/2007 Roberge et al. ............... 315/312
2008/0002107 A1* 1/2008 Mak et al. ........................ 349/96
2008/0245949 A1* 10/2008 Morimoto et al. ............ 250/205

FOREIGN PATENT DOCUMENTS

CN 1652169 8/2005
CN 1691112 11/2005
EP 1 282 099 2/2003
KR 1020050006103 1/2005
KR 1020060129759 12/2006
WO WO 2004/059605 7/2004
WO WO 2005/104081 11/2005

* cited by examiner

APPARATUS AND METHOD FOR DISPLAYING PICTURE IN PORTABLE TERMINAL

PRIORITY

This application claims priority under 35 U.S.C. §119(a) to an application filed in the Korean Intellectual Property Office on Nov. 6, 2006 and assigned Serial No. 2006-0108723, the contents of which are incorporated herein by reference.

BACKGROUND OF THE INVENTION

1. Field of the Invention

The present invention relates generally to an apparatus and method for displaying a picture in a portable terminal, and in particular, to an apparatus and method for displaying a picture, for adjusting a color quality of a picture to guarantee the visibility of an output picture depending on an ambient brightness in a portable terminal.

2. Description of the Related Art

In recent years, portable terminals such as mobile communication terminals or Personal Digital Assistants (PDAs) have become widely used. Portable terminals are increasing, as time goes by, in their number of uses, such as photographing an image or a video through an equipped digital camera, viewing a satellite broadcast, editing a document, playing a game, navigating, listening to music, transmitting/receiving a short message, and transmitting/receiving a multimedia message attached with a photographed image or moving picture, as well as simple telephony or schedule management.

The camera can use a Charge Coupled Device (CCD) or a Complementary Metal Oxide Semiconductor (CMOS) sensor. A display unit can use a Liquid Crystal Display (LCD). The miniaturization of cameras leads to a tendency to miniaturize devices containing cameras. Portable terminals can photograph and display video pictures as moving pictures or still pictures. Also, portable terminals can transmit photographed pictures to a base station. The portable terminals are equipped with camera modules for processing high-resolution video data. Thus, portable terminals can process and store high-resolution true color image data at the level of a general digital camera. However, the portable terminal is limited in size and thus, its display unit generally is small in size. Such a small-sized display unit can display a high-resolution true color video, however, a high-resolution true color video has a drawback that visibility, which is the ability of human visual perception, may be rather deteriorated under bright outdoor circumstances, as a resolution increases and the number of expressed colors increases.

In many cases, portable terminals are used mainly outdoors. In a case where an ambient brightness is greater than a brightness of the display unit, there occurs a drawback that visibility deteriorates enough to make it difficult for a user to identify a picture displayed on a display unit of the portable terminal. This drawback worsens due to a limitation in the brightness of a backlight source, in a case where the display unit is a transmissive LCD using only a backlight source.

In order to overcome the drawback, a new light transmission method or light source is under development. However, the real circumstances are that it is difficult to develop a product satisfying consumers even under a strong midday sunshine.

In a case where the drawbacks of visibility reduction appear complex, the reduction of visibility appears more greatly. In other words, visibility is greatly deteriorated when a display unit of a portable terminal displays high-resolution true color video data in a place where ambient brightness is greater than brightness of the display unit.

SUMMARY OF THE INVENTION

An aspect of the present invention is to substantially solve at least the above problems and/or disadvantages and to provide at least the advantages below. Accordingly, an aspect of the present invention is to provide an apparatus and method for displaying a picture in a portable terminal considering visibility.

Another aspect of the present invention is to provide an apparatus and method for displaying a picture, for adjusting a color quality of a picture in a portable terminal to guarantee the visibility of an output picture.

A further aspect of the present invention is to provide an apparatus and method for displaying a picture, for measuring an ambient brightness and adjusting a color quality of a picture depending on the ambient brightness in a portable terminal to guarantee the visibility of an output picture.

The above aspects are achieved by providing an apparatus and method for displaying a picture in a portable terminal.

According to one aspect of the present invention, there is provided an apparatus for displaying a picture in a portable terminal. The apparatus includes a display unit, an illumination sensor, a visibility decider, and a controller. The display unit displays state information or an indicator generated in operation of the portable terminal, the limited number of numerals and characters, a moving picture, and a still picture. The illumination sensor measures external brightness. The visibility decider identifies a visibility color quality that is a preset color quality corresponding to the external brightness measured by the illumination sensor. Upon sensing of generation of a visibility control event, the controller identifies, by the visibility decider, the visibility color quality corresponding to the external brightness measured by the illumination sensor, and controls and alters a currently set color quality into the identified visibility color quality for output to the display unit.

According to another aspect of the present invention, there is provided a method for displaying a picture in a portable terminal. The method includes identifying a visibility color quality corresponding to the external brightness upon sensing of generation of a visibility control event, identifying external brightness, identifying a set color quality that is a color quality currently outputted to a display unit, comparing whether the visibility color quality is equal to the set color quality, and altering the set color quality into the visibility color quality when the comparison result is that the visibility color quality is not equal to the set color quality.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

The present invention provides an apparatus and method for displaying a picture, for measuring ambient brightness and adjusting a color quality of a picture depending on the ambient brightness in a portable terminal to guarantee the visibility of an output picture. Prior to a detailed description of the present invention, the term "color quality" refers to the number of expressible colors. In other words, true color, 256 colors, 16 colors, and 8 colors all represent color qualities.

Figure 1:
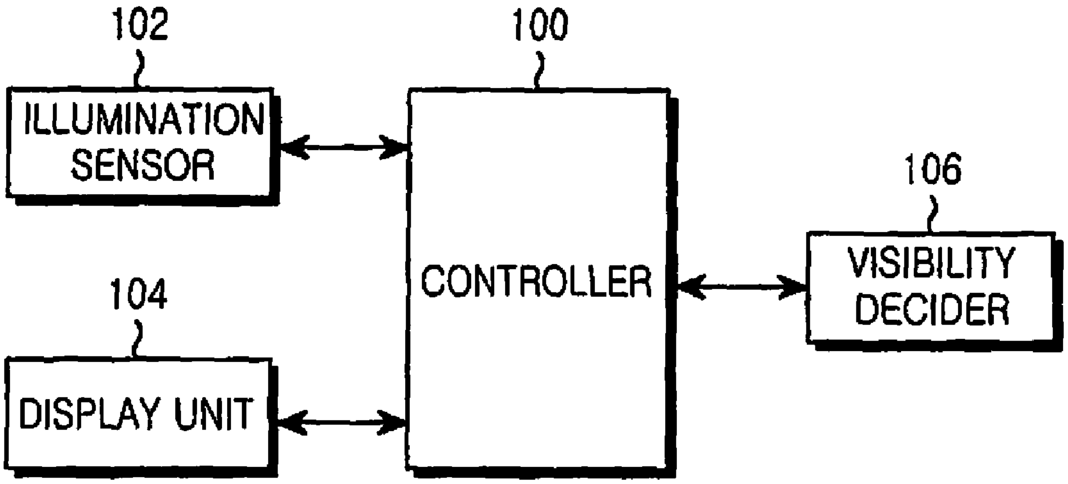
FIG. 1 illustrates architecture of a portable terminal for altering a color quality of an output picture depending on ambient brightness according to the present invention.

FIG. 1 illustrates architecture of a portable terminal for altering a color quality of an output picture depending on ambient brightness according to the present invention. Referring to FIG. 1, the portable terminal of the present invention includes a controller 100, an illumination sensor 102, a display unit 104, and a visibility decider 106.

The illumination sensor 102 is a sensor for measuring an external brightness, which is a brightness around the portable terminal, under the control of the controller 100. The illumination sensor 102 provides the measured external brightness to the visibility decider 106.

The display unit 104 displays state information (or an indicator) generated during an operation of the portable terminal, the limited number of numerals and characters, a video, a still picture, etc. The display unit 104 can use a color Liquid Crystal Display (LCD).

The LCD, which can be used as the display unit 104, can be classified into a transmissive LCD, a reflective LCD, and a transflective LCD. The transmissive LCD uses only a backlight source to display a picture. The reflective LCD uses only an external light source to display a picture. The transflective LCD uses both an external light source and a backlight source. However, because the transmissive LCD uses only the backlight source, the transmissive LCD has a low outdoor visibility compared to the reflective LCD and the transflective LCD using the external light source. Therefore, the present invention is applicable in a case where the display unit 104 uses the reflective LCD and the transflective LCD using the external light source.

Under the control of the controller 100, the visibility decider 106 searches for a preset color quality corresponding to the external brightness measured by the illumination sensor 102 to guarantee the visibility of an output picture. The preset color quality corresponding to external brightness is a color quality having a high visibility depending on external brightness measured through experiment. The preset color quality is obtained by dividing the external brightness into a plurality of levels and measuring a high-visibility color quality corresponding to each of the levels through experimentation. Hereinafter, the preset color quality corresponding to external brightness for increasing visibility is called a "visibility color quality" in the present invention. For example, in a case where external brightness is high due to strong light, the visibility decider 106 can set the visibility color quality to eight colors for a picture displayed on the display unit 104 and can set the visibility color quality to black and white or monochrome for a menu for interfacing with a user, etc.

If the controller 100 senses a generation of a visibility control event controlling a color quality depending on external brightness, the controller 100 controls the illumination sensor 102 to measure external brightness, controls the visibility decider 106 to identify a visibility color quality corresponding to the measured external brightness, and controls and alters a currently set color quality into the identified visibility color quality for output to the display unit 104.

The controller 100 controls the illumination sensor 102 to sense a variation of the external brightness in addition to a visibility control request of a picture output from the user. When a variation of the external brightness is greater than a preset range, the controller 100 determines that a visibility control event is generated.

The controller 100 controls a brightness of the display unit 104 depending on an external brightness sensed by the illumination sensor 102. For example, when external brightness increases due to strong light, the controller 100 controls the display unit 104 to display a picture at a high brightness corresponding to the increased external brightness. When external brightness decreases due to ambient darkness, the controller 100 controls the display unit 104 to display a picture at a low brightness. Outputting a picture at a high brightness in a bright place allows a user to relatively clearly recognize the picture. Outputting a picture at a low brightness in a dark place leads to a reduction of the glare of a display unit felt by the user.

The controller 100 can perform functions of the visibility decider 106. However, these are separately constructed and shown in order to distinguish and describe respective functions in the present invention. Thus, when a product is actually realized, it can be either constructed such that the visibility decider 106 can be processed in the controller 100, or they can be constructed separately.

A method for displaying a picture in a portable terminal considering visibility according to the present invention will be described with reference to FIG. 2 below.

Figure 2:
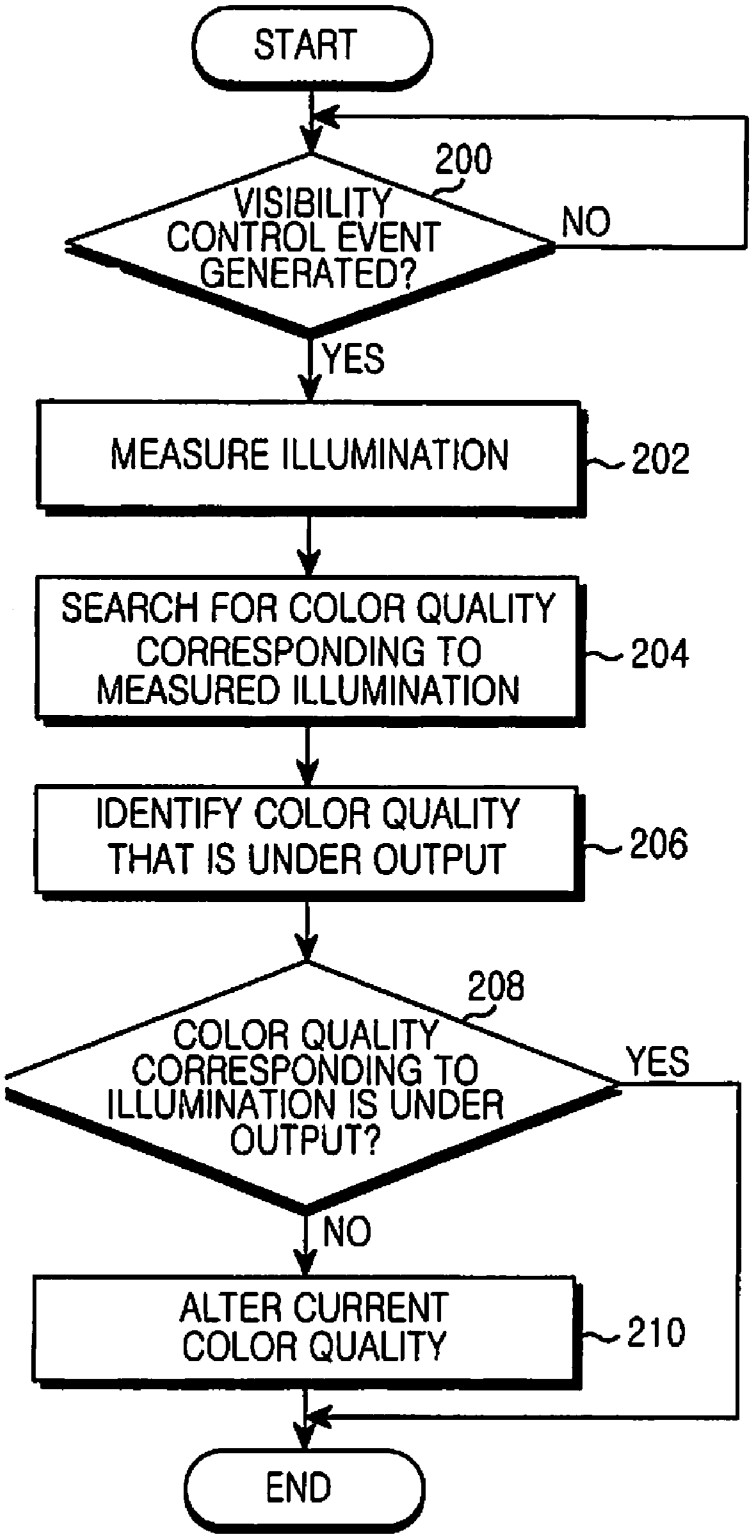
FIG. 2 is a flowchart illustrating a procedure of altering a color quality of an output picture depending on ambient brightness in a portable terminal according to the present invention.

FIG. 2 is a flowchart illustrating a procedure of altering a color quality of an output picture depending on an ambient brightness in a location of a portable terminal according to the present invention.

Referring to FIG. 2, in Step 200, the portable terminal checks whether it senses a generation of a visibility control event. If so, in Step 202, the portable terminal measures an external brightness by the illumination sensor 102. In Step 204, the portable terminal searches for a visibility color quality corresponding to the measured external brightness. In Step 206, the portable terminal identifies a set color quality being a color quality that is under output. In Step 208, the portable terminal compares whether the visibility color quality is equal to the set color quality that is under output.

If the comparison result of the Step 208 is that the visibility color quality is equal to the set color quality, that is, if the portable terminal is under output with the visibility color quality corresponding to external brightness, the portable terminal terminates the algorithm because a visibility control is unnecessary.

If the comparison result of the Step 208 is that the visibility color quality is not equal to the set color quality, in Step 210, the portable terminal alters the set color quality into the visibility color quality for output to the display unit 104. After that, the process of the present invention is terminated.

Regarding the generation or non-generation of the visibility control event of the Step 200, when receiving a visibility control request from the user as well as when a variation of external brightness sensed by the illumination sensor 102 is greater than a preset range, the portable terminal determines that the visibility control event is generated.

An exemplary embodiment of the present invention can include a computer readable code on a computer readable medium. The computer readable medium can include any data storage unit for storing data readable by a computer system. As examples of the computer readable medium, there are provided a magnetic storage medium (a Read Only Memory (ROM), a floppy disk, a hard disk, etc.), an optical recording medium (a Compact Disk-Read Only Memory (CD-ROM), a Digital Video Disk (DVD), etc.), and a storage mechanism such as a carrier wave (e.g., transmission over Internet). The computer readable medium can be distributed through a network connected to a computer system, and can be stored and executed in a distribution manner. A functional program, a code, and a code segment for realizing an exemplary embodiment of the present invention can be understood by a person having an ordinary skill in the art of the present invention.

As described above, the present invention provides an apparatus and method for displaying a picture in a portable terminal, for measuring external brightness and outputting a picture with a preset color quality corresponding to the external brightness. The present invention has an effect of altering a color quality depending on external brightness, thereby enhancing the visibility of an output picture.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An apparatus for displaying a picture in a portable terminal, the apparatus comprising:

a display unit for displaying one of state information and an indicator generated during an operation of the portable terminal, a limited number of numerals and characters, moving pictures, and still pictures;

an illumination sensor for measuring an external brightness;

a visibility decider for identifying a visibility color quality that is a preset color quality corresponding to the external brightness measured by the illumination sensor; and a controller for, upon sensing generation of a visibility control event, identifying, by the visibility decider, the visibility color quality corresponding to the external brightness measured by the illumination sensor, and controlling and altering a currently set color quality into the identified visibility color quality for an output to the display unit.

2. The apparatus of claim 1, wherein the visibility color quality identified by the visibility decider is preset by dividing the external brightness into a plurality of brightness levels and measuring a high-visibility color quality corresponding to each of the levels through experimentation.

3. The apparatus of claim 2, wherein the visibility color quality identified by the visibility decider decreases as the external brightness increases, and increases as the external brightness decreases.

4. The apparatus of claim 2, wherein the visibility color quality identified by the visibility decider can be set to eight colors for a picture displayed on the display unit and can be set to black and white, or monochrome for a menu for interfacing with a user when the external brightness is high.

5. The apparatus of claim 1, wherein when a variation of the external brightness is greater than a preset range, the controller senses the variation of the external brightness through the illumination sensor and senses the generation of the visibility control event.

6. The apparatus of claim 1, wherein the controller controls the display unit to adjust a display brightness of the display unit to a preset brightness corresponding to the external brightness measured by the illumination sensor.

7. The apparatus of claim 6, wherein the controller controls the display brightness of the display unit to a higher-than-normal brightness state as the external brightness measured by the illumination sensor increases, and controls the display brightness of the display unit to a lower-than-normal brightness state as the external brightness decreases.

8. The apparatus of claim 1, wherein the display unit is a reflective Liquid Crystal Display (LCD) using only an external light source to output a picture.

9. The apparatus of claim 1, wherein the display unit is a transflective LCD using both an external light source and a backlight source.

10. A method for displaying a picture in a portable terminal, the method comprising:

upon sensing a generation of a visibility control event, identifying an external brightness;

identifying a visibility color quality that is a preset color quality corresponding to the external brightness;

identifying a set color quality that is a color quality currently output to a display unit;

comparing whether the visibility color quality is equal to the set color quality; and when the comparison result is that the visibility color quality is not equal to the set color quality, altering the set color quality into the visibility color quality.

11. The method of claim 10, wherein the visibility color quality is preset by dividing the external brightness into a plurality of brightness levels and measuring a high-visibility color quality corresponding to each of the levels through experimentation.

12. The method of claim 11, wherein the visibility color quality decreases as the external brightness increases, and increases as the external brightness decreases.

13. The method of claim 11, wherein the visibility color quality can be set to eight colors for a picture displayed on the display unit and can be set to black and white, or monochrome for a menu for interfacing with a user when the external brightness is high.

14. The method of claim 10, wherein the sensing of the generation of the visibility control event comprises:

sensing a variation of the external brightness; and when the variation of the external brightness is greater than a preset range, sensing the generation of the visibility control event.

15. The method of claim 10, further comprising: adjusting a display brightness of the display unit to a preset brightness corresponding to the external brightness.

16. The method of claim 15, wherein the adjusting of the display brightness of the display unit comprises:

adjusting the display brightness of the display unit to a higher-than-normal state as the external brightness increases; and adjusting the display brightness of the display unit to a lower-than-normal state as the external brightness decreases.

17. The method of claim 10, wherein the display unit is a reflective LCD using only an external light source to output a picture.

18. The method of claim 10, wherein the display unit is a transflective LCD using both an external light source and a backlight source to output a picture.

19. A non-transitory computer readable medium for displaying a picture, comprising:

a first code for identifying an external brightness when sensing a generation of a visibility control event;

a second code for identifying a visibility color quality that is a preset color quality corresponding to the external brightness;

a third code for identifying a set color quality that is a color quality currently output to a display unit;

a fourth code for comparing whether the visibility color quality is equal to the set color quality; and a fifth code for altering the set color quality into the visibility color quality when the comparison result is that the visibility color quality is not equal to the set color quality.

* * * * *